United States Patent
Yokoya

[11] Patent Number: 5,990,540
[45] Date of Patent: Nov. 23, 1999

[54] SEMICONDUCTOR DEVICE AND METHOD FOR MANUFACTURING THE SAME

[75] Inventor: Noboru Yokoya, Yokohama, Japan

[73] Assignee: Kabushiki Kaisha Toshiba, Kawasaki, Japan

[21] Appl. No.: 08/990,966

[22] Filed: Dec. 15, 1997

[51] Int. Cl.⁶ .................................................. H01L 23/544
[52] U.S. Cl. ............................................................ 257/620
[58] Field of Search .................................... 257/401, 620; 438/460

[56] References Cited

U.S. PATENT DOCUMENTS

| | | | |
|---|---|---|---|
| 4,744,047 | 5/1988 | Okamoto et al. | 364/900 |
| 4,950,910 | 8/1990 | Yasuda et al. | 250/492.3 |
| 4,998,134 | 3/1991 | Isohata et al. | 355/53 |
| 5,341,024 | 8/1994 | Rosotker | 257/620 |
| 5,384,219 | 1/1995 | Dao et al. | 430/5 |
| 5,393,987 | 2/1995 | Abboud et al. | 250/492.22 |
| 5,437,946 | 8/1995 | McCoy | 430/5 |
| 5,439,764 | 8/1995 | Alter et al. | 430/5 |
| 5,481,472 | 1/1996 | Chung et al. | 364/491 |
| 5,587,834 | 12/1996 | Noguchi | 359/558 |

*Primary Examiner*—Tom Thomas
*Assistant Examiner*—Thien Fuong Tran
*Attorney, Agent, or Firm*—Banner & Witcoff, Ltd.

[57] ABSTRACT

A mask pattern applied to a peripheral portion of a wafer has an open/close ratio substantially the same as that in a central portion thereof and prepared according to a looser design rule than that for forming the central portion. The looser design rule has a high latitude for out-of-focus exposure and provides high resistance to pattern removal. Since the open/close ratios in the central portion and the peripheral portion of the wafer are substantially the same, variance in process accuracy due to a micro-loading effect can be prevented.

7 Claims, 8 Drawing Sheets

SEMICONDUCTOR DEVICE AND METHOD FOR MANUFACTURING THE SAME

BACKGROUND OF THE INVENTION

The present invention relates generally to a semiconductor device and a method for manufacturing the same, and more particularly to an improvement of a pattern formed on a wafer and a method for forming the pattern.

To prepare a mask for use in a process of forming an integrated circuit, in general, a diagram depicted at 1000 to 5000 magnification of a circuit is first prepared. The circuit diagram is converted by a CAD system to data for driving a pattern generator or electron beam exposure system. The pattern generator or electron beam exposure system forms a reticle (enlargement mask) 4 to 10 times enlarged from an actual size.

Generally, a pattern for one or several chips of an integrated circuit is depicted on a reticle. By means of a photo-repeater, the pattern on the reticle is reduced and a number of chip patterns are formed on a hard blank (or photographic plate) to obtain a master mask of an actual size. A master mask can be formed directly by an electron beam exposure system without a photo-repeater.

In recent years, as the integration density of an integrated circuit has been greatly increased and a projection aligner of non-contact type has been developed, a master mask of high accuracy is directly used in a production line, or a wafer is exposed via a reticle by a shot-by-shot exposure by means of a wafer stepper and a projection aligner.

A step and repeat system is one of the typical shot-by-shot exposure systems. In this system, a wafer is vacuum-fixed to an X-Y stage which can be moved two-dimensionally, and the wafer is exposed every time it is transferred by a fixed distance. Although the throughput of this system is lower than that of the full wafer exposure system, a pattern having high resolution is obtained by easy control, since a central portion of the lens used in the step and repeat system has less distortion. In addition, since patterns formed in different steps can be placed one on another, positioning with high accuracy can be achieved.

Both in the step and repeat system and the full wafer exposure system, when a chip pattern is transferred to a wafer, a peripheral portion the pattern may be displaced from the wafer, that is, outline imperfect chips are formed. According to the conventional manufacturing art, to form a pattern on all the portion of a wafer in the same manufacturing conditions, the wafer is exposed at a critical level with the same pattern both in a central portion and a peripheral portion of the wafer.

However, it is difficult to form, particularly, chips of a sub-half micron pattern in the peripheral portion of the wafer in the same design rule pattern as used in the central portion. The reasons for the difficulty are: the depth of focus is inevitably narrow when a fine pattern is projected; the focus in a region near the central portion is also applied to the peripheral portion of the wafer, since an area sufficient for focus measurement cannot be ensured in the peripheral portion; and the wafer is less flat in the peripheral portion than in the central portion.

Further, if a pattern is out of focus, the pattern may be removed in the steps subsequent to the pattern forming, generating foreign matter and lowering the manufacturing yield. More specifically, if foreign matter is adhered to a wafer, it may function as a mask in dry etching or ion implantation, thus forming etching remainder or a conductive inverted layer immediately under the foreign matter. Alternatively, atoms constituting the foreign matter may diffuse into the substrate or lower the adhesion strength of a deposited film.

Of all the external defects generated in the wafer process, defects, which may result from foreign matter adhered to the wafers or masks, are considered to be about 70%. Although outline imperfect chips are not the only cause of all of the external defects, they can be a potential source of defects.

BRIEF SUMMARY OF THE INVENTION

It is accordingly an object of the present invention to provide a semiconductor device and a method for manufacturing the same, using a mask design in a wafer level which does not cause pattern removal in the steps subsequent to pattern forming.

To achieve the above object, according to the present invention, there is provided a semiconductor device wafer comprising:

a semiconductor substrate:

a plurality of semiconductor device chips having a perfect outline, each including a pattern formed according to a predetermined design rule; and a plurality of outline imperfect chips, surrounding the plurality of semiconductor device chips on the semiconductor substrate, and having an imperfect outline, due to including an edge of the semiconductor substrate, each of the plurality of outline imperfect chips including a pattern formed according to a looser design rule than the predetermined design rule.

It is preferable that each of the semiconductor device chips include a plurality of first wires, and a minimum width of the first wires be at most 0.30 $\mu$m.

It is preferable that each of the outline imperfect chips include a plurality of second wires, and a minimum width of the second wires be 1.6 to 2.4 times that of the minimum width of the first wires.

It is preferable that each of the semiconductor device chips include a plurality of first wiring layers and each of the outline imperfect chips include a plurality of second wiring layers, a ratio of a wiring area to a non-wiring area in each of the plurality of second wiring layers being substantially the same as that in each of the plurality of first wiring layers.

It is preferable that each of the semiconductor device chips include a plurality of first wires and each of the outline imperfect chips include a plurality of second wires, a minimum width of the second wires being 1.6 to 2.4 times that of a minimum width of the first wires and that each of the semiconductor device chips include a plurality of first wiring layers and each of the outline imperfect chips include a plurality of second wiring layers, a ratio of a wiring area to a non-wiring area in each of the plurality of second wiring layers being substantially the same as that in each of the plurality of first wiring layers.

It is preferable that each of the semiconductor device chips include a plurality of first contact holes, and a minimum diameter of the first contact holes be at most 0.35 $\mu$m.

It is preferable that each of the outline imperfect chips include a plurality of second contact holes, and a minimum diameter of the second contact holes be 1.6 to 2.4 times that of the minimum diameter of the first contact holes.

According to the present invention, there is provided a method for manufacturing a semiconductor device comprising the steps of:

preparing a first exposure mask designed according to a predetermined design rule;

preparing a second exposure mask designed according to a design rule looser than the predetermined design rule;

sequentially exposing a semiconductor wafer coated with a resist, using the first exposure mask, when an exposure field is completely included in the semiconductor wafer, and the second exposure mask, when the exposure field goes out of the semiconductor wafer; and subjecting the sequentially exposed semiconductor wafer to a predetermined process.

It is preferable that the step of preparing the first exposure mark include a step of preparing a mask for forming a plurality of first wires, a minimum width of the first wires being at most 0.30 µm.

It is preferable that the step of preparing the second exposure mask include a step of preparing a mask for forming a plurality of second wires, a minimum width of the second wires being 1.6 to 2.4 times that of the minimum width of the first wires.

It is preferable that the steps of preparing the first and the second exposure mask includes a step of making an open/close ratio of the first exposure mask substantially equal to that of the second exposure mask.

It is preferable that the steps of preparing the first and the second exposure mask includes a step of preparing a plurality of second masks for forming a plurality of second wires, a minimum width of the second wires being 1.6 to 2.4 times that of the minimum width of the first wires.

It is preferable that the step of preparing the second exposure mask includes a step of preparing a mask for forming a plurality of second wires, a minimum width of the second wires being 1.6 to 2.4 times that of the minimum width of the first wires and making an open/close ratio of the second exposure mask substantially equal to that of the first exposure mask.

It is preferable that the step of preparing the first exposure mark include a step of preparing a mask for forming a plurality of first contact holes, a minimum diameter of the first contact holes being at most 0.35 µm.

It is preferable that the step of preparing the second exposure mask include a step of preparing a mask for forming a plurality of second contact holes, a minimum diameter of the second contact holes being 1.6 to 2.4 times that of the minimum diameter of the first contact holes.

As described above, according to the present invention, the pattern applied to the peripheral portion of a wafer has an open/close ratio substantially the same as that in the central portion thereof and prepared according to a looser design rule than a standard design rule for forming the central portion.

To prevent variance in process accuracy due to a microloading effect, the same pattern cannot be used in the central and peripheral portions of the wafer. It is important that the open/close ratio in the peripheral portion of the wafer be substantially the same as that in the central portion.

As compared to the pattern according to the standard design rule, the pattern according to the looser design rule has a greater depth of focus, and provides a higher latitude for out-of-focus exposure and higher resistance to pattern removal in the subsequent steps. As a result, it is possible to manufacture semiconductor devices of high reliability at a high manufacturing yield.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIGS. 9A to 13A are diagrams showing sequential manufacturing steps of the memory device (perfect exposure field) according to the second embodiment, taken along the line C—C of FIG. 8;

FIGS. 9B to 13B are diagrams showing sequential manufacturing steps of the memory device (imperfect exposure field) according to the second embodiment, taken along the line C—C of FIG. 8.

DETAILED DESCRIPTION OF THE INVENTION

Prior to describing embodiments of the present invention, problems in a step of exposing a peripheral portion of a wafer and subsequent steps will be described.

Figure 1:
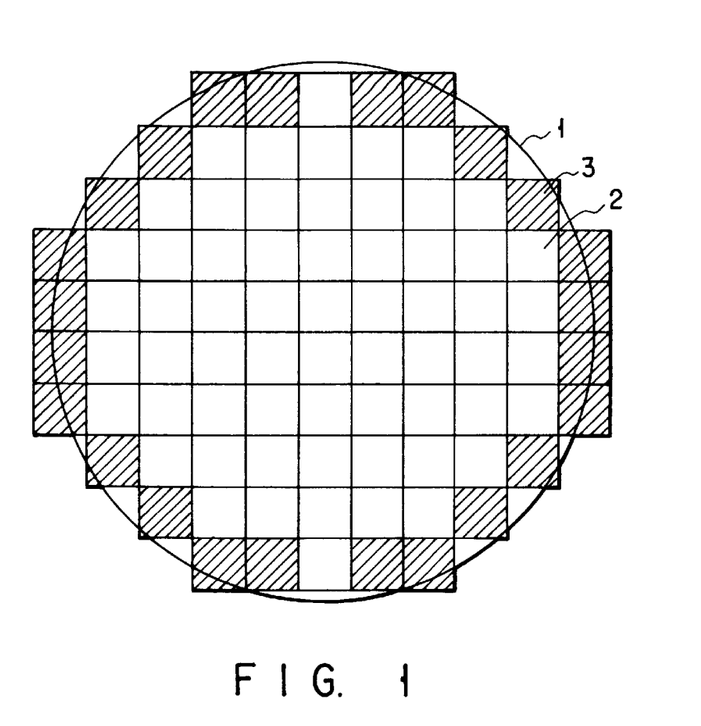
FIG. 1 is a diagram for explaining an arrangement of a perfect exposure field (outline perfect chips) and an imperfect exposure field (outline imperfect chips) in a semiconductor wafer.

FIG. 1 shows a state of a mask pattern transferred to a wafer for forming a super LSI of sub-half micron level. A predetermined resist is applied to a wafer 1 and a mask pattern is successively exposed on the resist by the step and repeat system, so that the mask pattern is transferred to the overall surface of the wafer. A square region in FIG. 1 is one exposure field of the mask pattern.

To assure uniformity on the wafer in etching and deposition steps after the exposure step, the mask pattern is formed on the overalls surface of the wafer. For this reason, in the hatched exposure fields (or chips) formed in the peripheral portion of the wafer, some exposure fields are out of the wafer 1, thus producing outline imperfect chips 3. Contrarily, in the central portion of the wafer, since perfect exposure fields are obtained, outline perfect chips 2 are formed.

Figure 2:
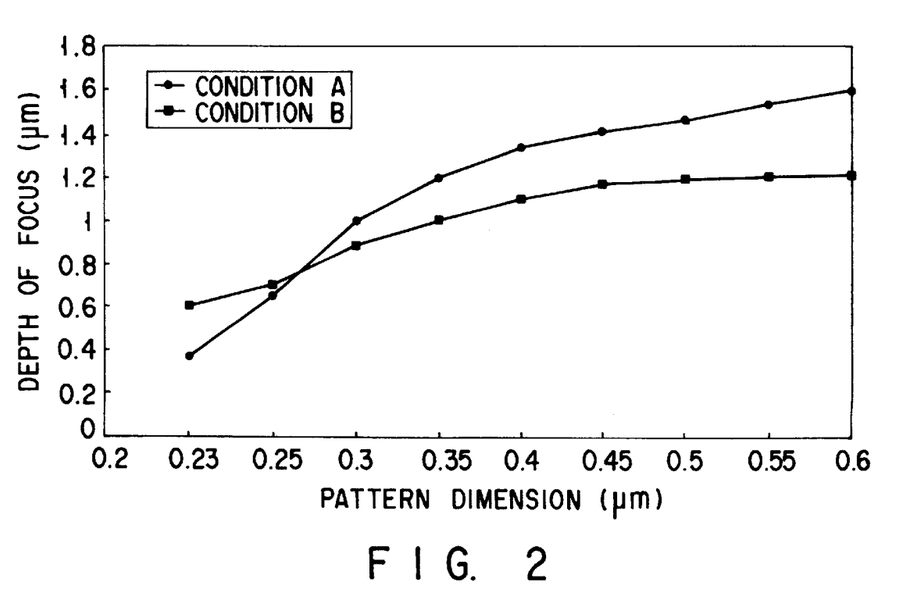
FIG. 2 is a graph showing the relationship between a pattern dimension and a depth of focus.

In the peripheral portion of the wafer, the pattern is out of focus due to a narrow depth of focus, a too small wafer region to measure the focus and the flatness less than that of the central portion, as described above. FIG. 2 shows two examples (conditions A and B) of the relationship between a pattern dimension (line width) ($\mu$m) and a depth of focus ($\mu$m). It is understood from FIG. 2 that the depth of focus is suddenly decreased when the design rule (pattern dimension) is 0.35 $\mu$m or smaller.

Figures 3A, 3B, 3C:
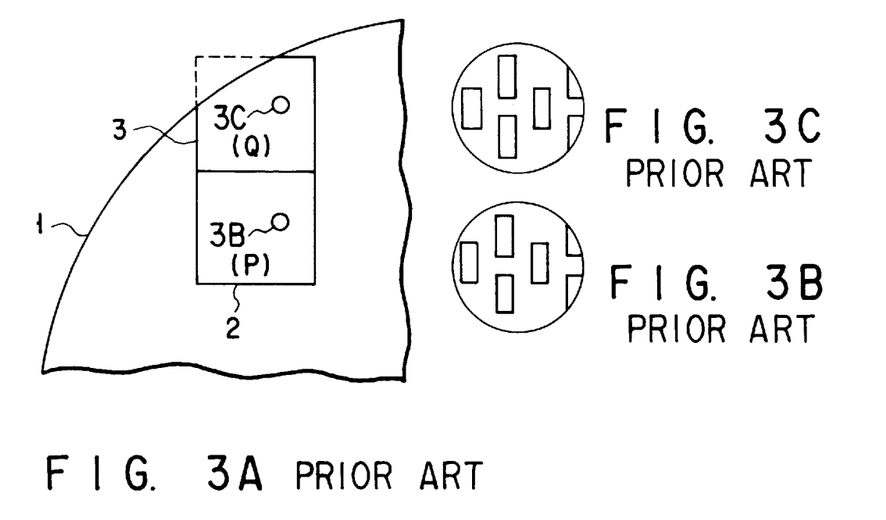
FIG. 3A is a diagram for explaining a line pattern applied to a perfect exposure field and an imperfect exposure field according to the prior art.
FIGS. 3B and 3C are enlarged views of 3B and 3C shown in FIG. 3A, respectively.
Figures 3D, 3E, 3F:
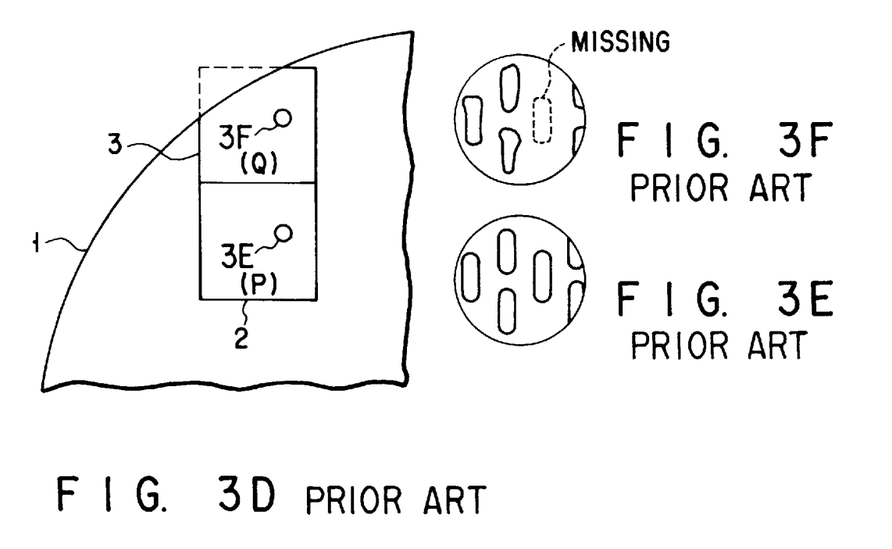
FIG. 3D is a diagram for explaining a resist pattern after developing the perfect exposure field and the imperfect exposure field shown in FIG. 3A.
FIGS. 3E and 3F are enlarged views of 3E and 3F shown in FIG. 3D, respectively.

FIGS. 3A to 3F are plan views, specifically showing problems in a peripheral portion of a wafer. FIG. 3A shows a positional relationship between a perfect exposure field 2 and an imperfect exposure field 3 in a peripheral portion of a wafer. FIGS. 3B and 3C show enlarged patterns of regions P and Q of the fields 2 and 3, respectively. FIGS. 3D to 3F show actual resist patterns after exposure. In the incomplete exposure field 3, a part of the pattern is missing and the shape of pattern is broken (FIG. 3F). In contrast, in the perfect exposure field 2, the mask pattern is reproduced substantially completely (FIG. 3E).

The present invention has been made in consideration of the above matters. According to the present invention, although an open/close ratio of the peripheral portion of a wafer is similar to that in the central portion, a looser design rule is applied to an imperfect exposure field in the peripheral portion, so that the peripheral portion can be prevented from being out of focus. Embodiments of the present invention will be described below.

First Embodiment

Figure 4A:
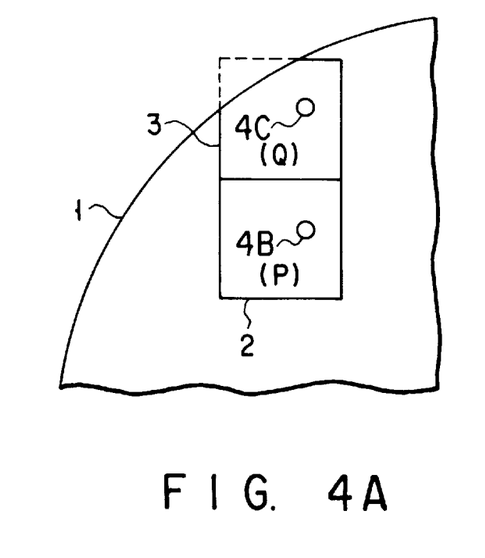
FIG. 4A is a diagram for explaining a line pattern applied to a perfect exposure field and an imperfect exposure field according to a first embodiment of the present invention.
Figure 4B:
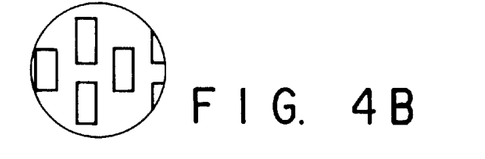
FIGS. 4B and 4C are enlarged views of 4B and 4C shown in FIG. 4D, respectively.
Figure 4C:
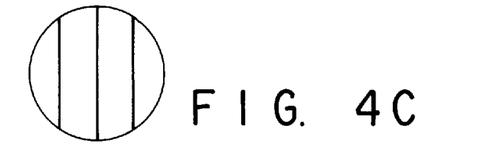

FIGS. 4A to 4C are diagrams for explaining a method for forming a pattern according to a first embodiment of the present invention. The diagrams are schematic plan views showing layouts of a perfect exposure field 2 on a wafer 1 and an imperfect exposure sure 3 in a peripheral portion of the wafer. In the perfect exposure field 2, a pattern (a line pattern of an open/close ratio of 50%) of an element region having a pattern width of 0.25 $\mu$m is formed.

Figure 4D:
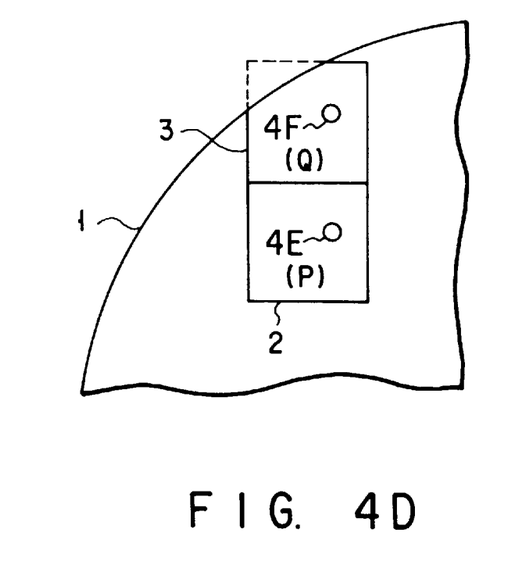
FIG. 4D is a diagram for explaining a resist pattern after developing the perfect exposure field and the imperfect exposure field shown in FIG. 4A.
Figure 4E:
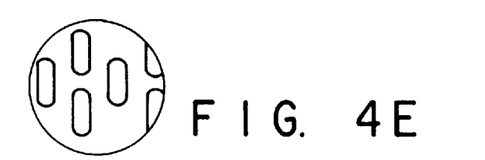
FIGS. 4E and 4F are enlarged views of 4E and 4F shown in FIG. 4D, respectively.
Figure 4F:
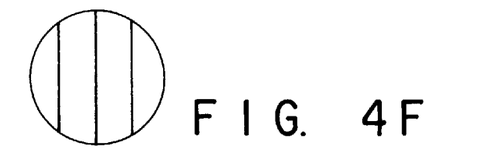

In the imperfect exposure field 3, the open/close ratio is the same as that in the perfect exposure field, i.e., 50%. However, the pattern width or a line pattern in this field is 0.5 $\mu$m. With this pattern formed of two line patterns of different line width, even in the condition B shown in FIG. 2, the depth of focus in the case of the pattern width 0.5 $\mu$m is about 1.1 $\mu$m. In this case, the exposure latitude is increased about 60% as compared to the depth of focus of about 0.7 $\mu$m in the case of the pattern width 0.25 $\mu$m. For this reason, both in the regions P and Q on the wafer, as shown in FIGS. 4D to 4F, a resist pattern corresponding to the original mask pattern can be obtained. In a case of such a wiring mask as shown in FIGS. 4A to 4C, if the line width in the perfect exposure field is 0.25 $\mu$m, it is preferable that the line width in the imperfect exposure field be 0.4 $\mu$m to 0.6 $\mu$m (or 160% to 200% of that in the perfect exposure field).

Figure 5A:
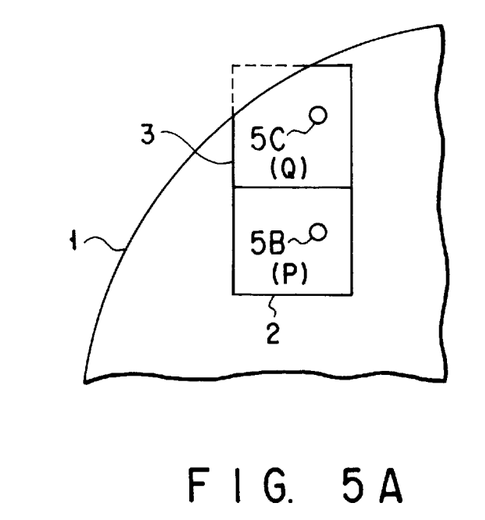
FIG. 5A is a diagram for explaining a contact hole pattern applied to a perfect exposure field and an imperfect exposure field according to the first embodiment of the present invention.
Figure 5B:
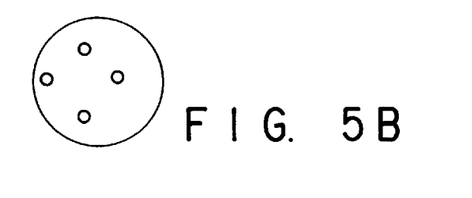
FIGS. 5B and 5C are enlarged views of 5B and 5C shown in FIG. 5A, respectively.
Figure 5C:
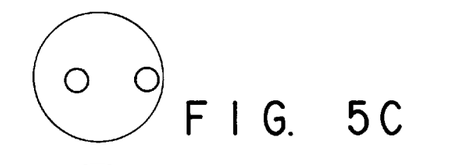
Figure 5D:
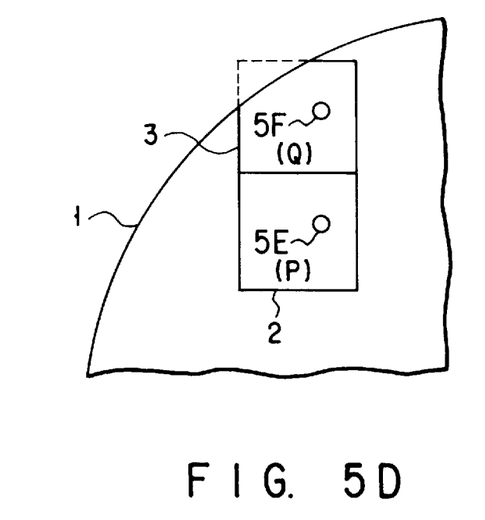
FIG. 5D is a diagram for explaining a resist pattern after developing the perfect exposure field and the imperfect exposure field shown in FIG. 5A.
Figure 5E:
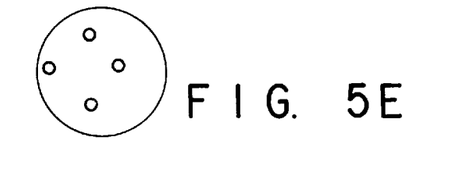
FIGS. 5E and 5F are enlarged views of 5E and 5F shown in FIG. 5D, respectively.
Figure 5F:
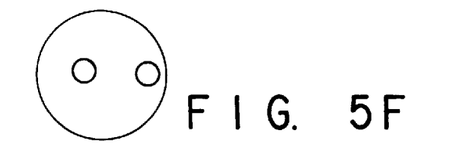

FIGS. 5A to 5C show mask patterns of a contact layer. In a perfect exposure field 2, the pattern has contact holes of a diameter of 0.3 $\mu$m. An imperfect exposure field 3 has contact holes of a diameter of 0.6 $\mu$m. In a case of a contact mask pattern, if the hole diameter is 0.3 $\mu$m in the perfect exposure field 2, it is preferable that the hole diameter in the imperfect exposure field 3 be 0.5 $\mu$m to 0.7 $\mu$m (or 160% to 200% to that in the perfect exposure field).

If the pattern in the imperfect exposure field 3 is the same as that in the perfect exposure field 2, contact holes in the imperfect exposure field 3 may be closed. However, if the hole diameter in the imperfect exposure field 3 is unnecessarily large, a central portion of the buried hole on the wafer may be recessed, when the contact hole is buried with conductive material. The formation of a recess in the buried hole is not preferable from the viewpoint of uniformity of the overall surface of the wafer. Therefore, it is preferable that the diameter of a contact hole be within the aforementioned range. In the case of a line pattern, if the distance between lines is too large, the same problem as in the contact hole pattern will arise.

The present invention provides a notable effect in a case where a line width is 0.3 $\mu$m or smaller or a contact hole diameter is 0.35 $\mu$m or smaller in the perfect exposure field.

The aforementioned mask, having two design rules for a perfect exposure field and an imperfect exposure field, can be transferred to a wafer in the following three methods.

In a first method, a reticle for a perfect exposure field and a reticle for imperfect exposure field are individually prepared. To transfer a mask on a wafer, exposure is performed twice, while one reticle being exchanged with the other. This method is disadvantageous in that the exchange is troublesome.

Figure 6A:
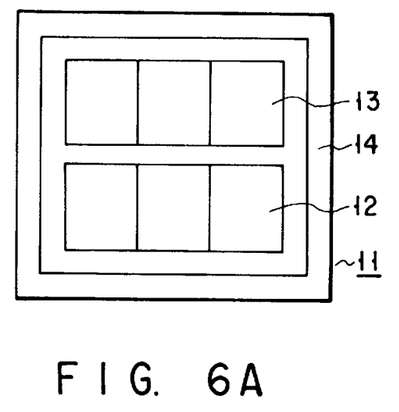
FIGS. 6A and 6B are diagrams showing examples of pattern arrangement of a reticle according to the first embodiment of the present invention.
Figure 6B:
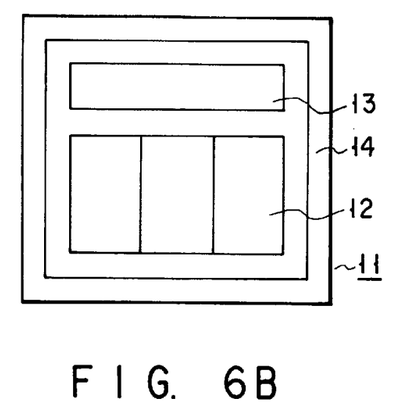

In a second method, as shown in FIG. 6A, a pattern 13 for an imperfect exposure field is formed in part of a normal reticle 11 (on which a pattern 12 for three chips of a perfect exposure field is formed, in cases of FIGS. 6A and 6B). A reference numeral 14 denotes an opaque film formed on the periphery of the reticle. When a perfect exposure field is exposed, the pattern 13 for the imperfect exposure field is covered by an opaque member. When an imperfect exposure field is exposed, the pattern 12 for the perfect exposure field is covered by the opaque member.

The patterns 12 and 13 for the perfect and imperfect exposure fields do not necessarily have the same size, but can be different in size as shown in FIG. 6B. With these patterns, the same chip size is exposed by changing the exposure condition.

When one reticle incorporates two patterns for the perfect and imperfect exposure fields, the efficiency of patterning is improved, since it is unnecessary to exchange reticles.

In a third method, an exposure system is provided with a plurality of kinds of loose design standard masks for the imperfect exposure field, and a suitable one is selected therefrom in accordance with the pattern of the perfect exposure field.

Figure 7:
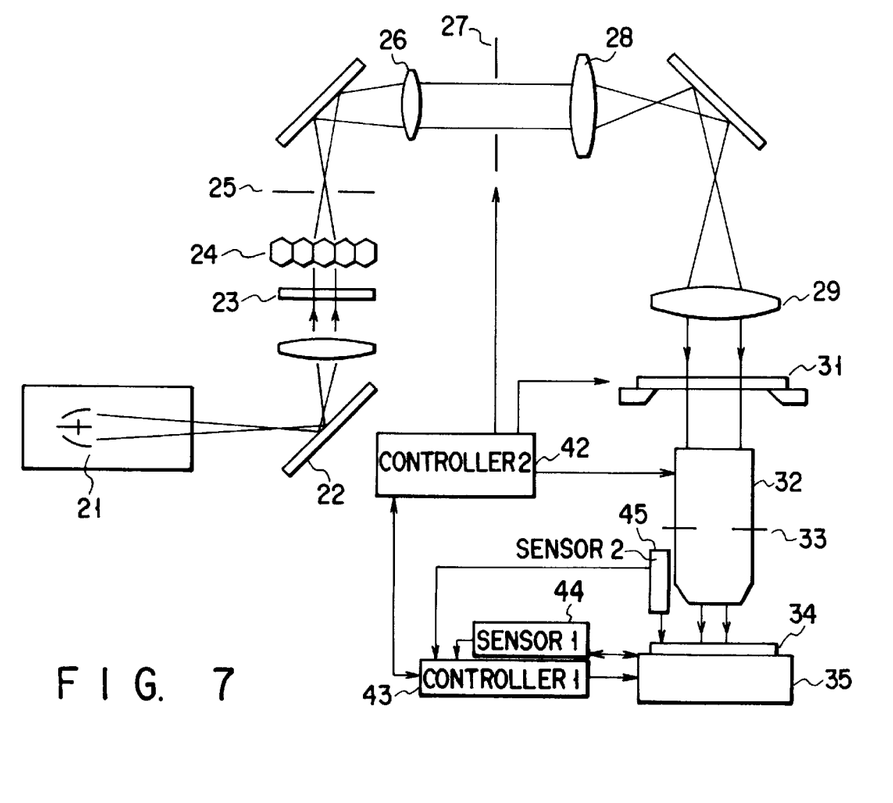
FIG. 7 is a schematic diagram showing a projection exposure system used in the first embodiment of the present invention.

FIG. 7 shows a structure of an exposure system suitable for the aforementioned second and third methods. The exposure system shown in FIG. 7 comprises a light source 21 having, for example, an Hg—Xe lamp or a KrF or ArF laser. It also comprises a cold mirror 22, a narrow-band filter 23, and a fly eye lens 24, and an aperture 25, which is inserted in a position generally called a two-dimensional light source plane. It further comprises an input lens 26, a reticle blind 27 for restricting an exposure region of an exposure mask, an output lens 28, a collimation lens 29, an exposure mask 31, and a projection optical system 32. The system 32 projects a pattern formed on the exposure mask 31 onto a substrate by means of a lens or a mirror or a combination thereof. The exposure system further comprises a stop 33 for determining a numerical aperture (NA). The stop 33 is inserted in a pupil of the projection optical system. A reference numeral 34 denotes a wafer substrate, 35 a wafer stage, 43 a wafer stage control unit (first controller), 44 a wafer XY position detecting mechanism (first sensor), and 45 a wafer Z position detecting mechanism (second sensor).

A reference numeral 42 denotes a mask control mechanism (second controller). In the second method, the controller 2 controls the reticle blind on the basis of positional information of the wafer supplied from the controller 1, and determines an exposure region of the reticle, so that a normal mask pattern is exposed to the central portion of the wafer and a loose design pattern is exposed to the peripheral portion of the wafer.

In the third method, the controller 2 controls the reticle blind on the basis of positional information of the wafer supplied from the controller 1 and switches the mask 31, so that a normal mask pattern is exposed to the central portion of the wafer and a suitable loose design pattern selected from a plurality of loose design masks is exposed to the peripheral portion of the wafer.

With the exposure device as described above, a loose design mask can be easily applied to the peripheral portion of the wafer.

Second Embodiment

A second embodiment of the present invention will now be described. In this embodiment, NAND EEPROM gate lines of a semiconductor device are prepared using the mask according to the first embodiment.

Figure 8:
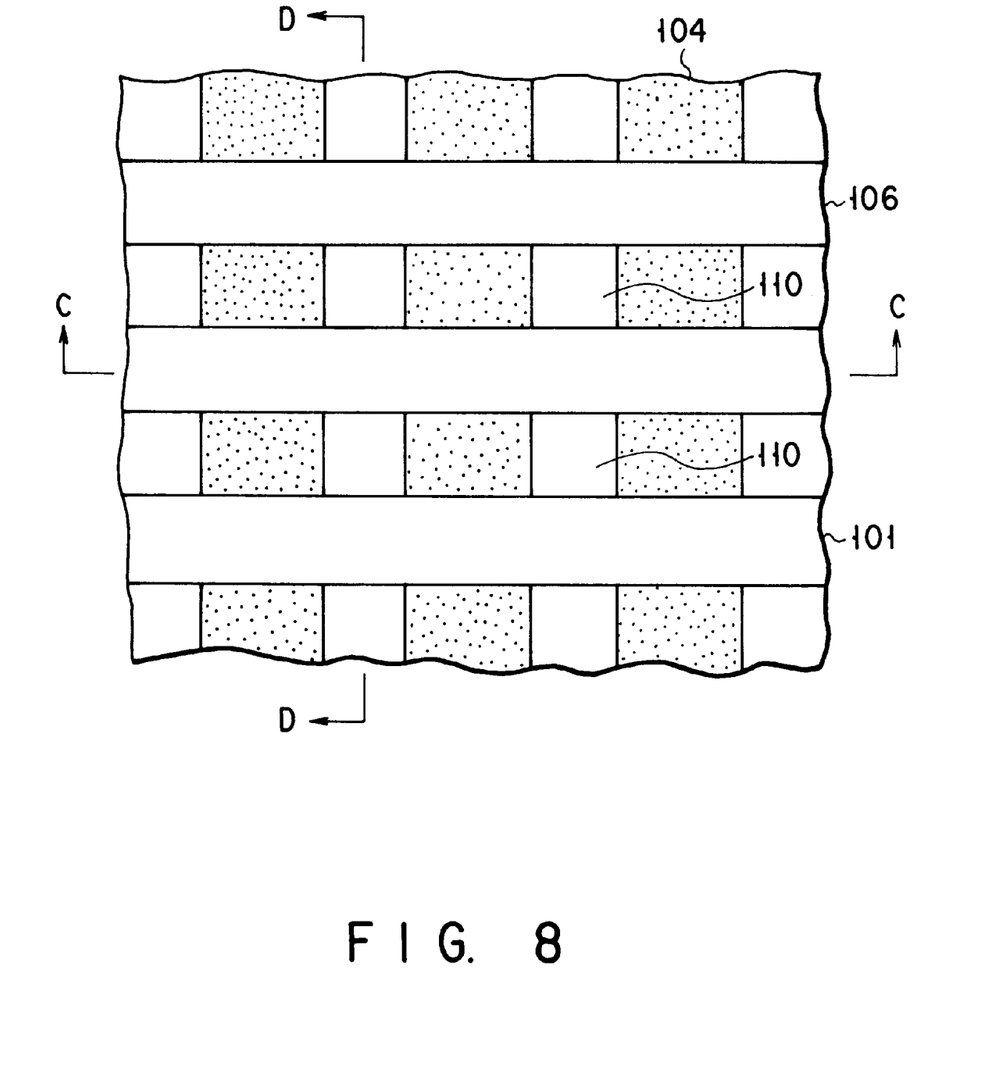
FIG. 8 is a schematic plan view of a memory device according to a second embodiment of the present invention.

FIG. 8 is a schematic plan view of NAND EEPROM gate lines according to the second embodiment of the present invention. In FIG. 8, a reference numeral 101 denotes a semiconductor substrate, 104 an element isolating region, and 106 a floating gate.

FIGS. 9A, 10A, 11A, 12A and 13A are cross-sectional views of the region P of the perfect exposure field 2 shown in FIG. 4A, taken along the line C—C in FIG. 8. These drawings are ordered in sequence of manufacturing steps.

FIGS. 9B, 10B, 11B, 12B and 13B are cross-sectional views of the region Q of the imperfect exposure field 3 shown in FIG. 4A, taken along the line C—C in FIG. 8. These drawings are ordered in sequence of manufacturing steps.

Figure 13A:
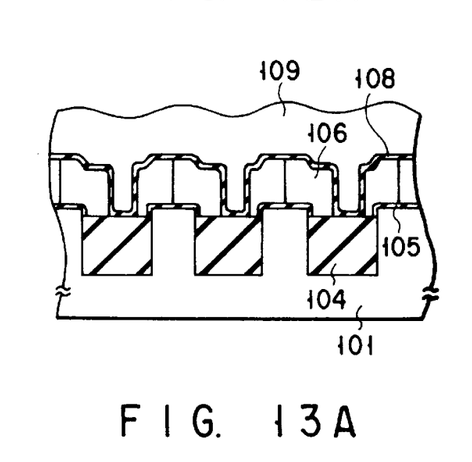
Figure 13B:
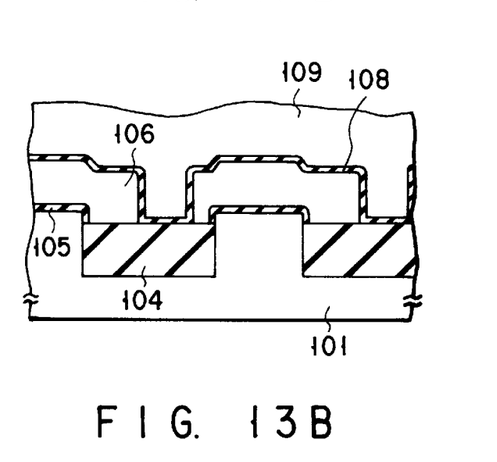
Figure 14A:
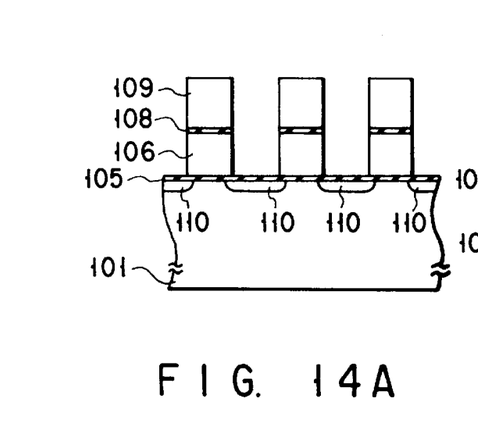
FIGS. 14A and 14B are cross-sectional views, corresponding to the steps of FIGS. 13A and 13B, taken along the line D—D of FIG. 8.
Figure 14B:
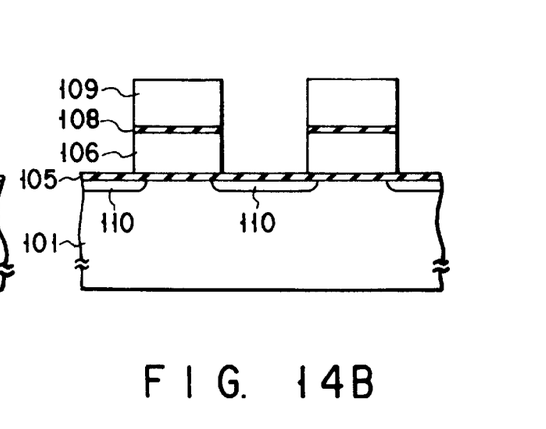

FIGS. 14A and 14B are cross-sectional views of the regions P and Q in the steps respectively corresponding to FIGS. 13A and 13B, taken along the line D—D in FIG. 8.

First, an oxide film 102 having a thickness of 100 nm, which is to serve as a mask pattern when forming an isolation groove, is formed by thermal oxidation on the overall surface of a P-type silicon substrate 101 (e.g., a resistivity 10 Ω and the crystalline plane (100)).

Figure 9A:
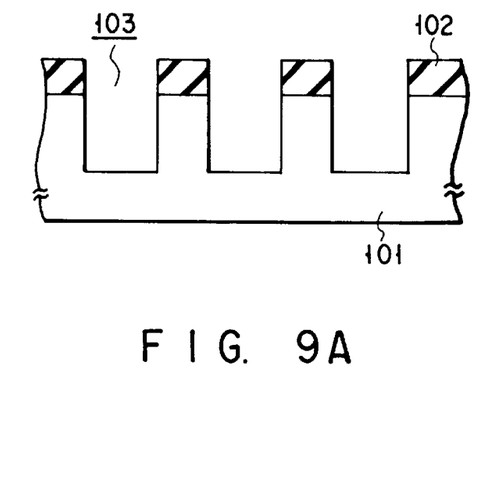
Figure 9B:
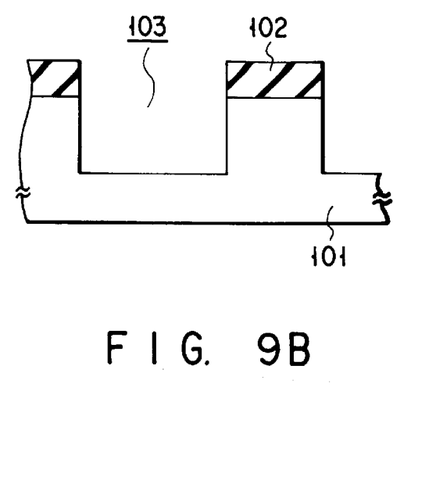

Then, the oxide film 102 is patterned as shown in FIGS. 9A and 9B, thereby forming a mask pattern. Using the mask pattern as a mask, the P-type silicon substrate 101 is vertically etched by the reactive ion etching. As a result, an element isolating groove 103 having a depth of 0.5 $\mu$m is formed. The width of the element isolating groove 103 is 0.3 $\mu$m in the perfect exposure chip shown in FIG. 9A and 0.6 $\mu$m in the imperfect exposure chip shown in FIG. 9B.

Figure 10A:
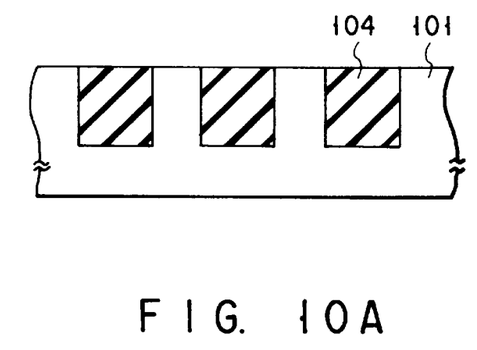
Figure 10B:
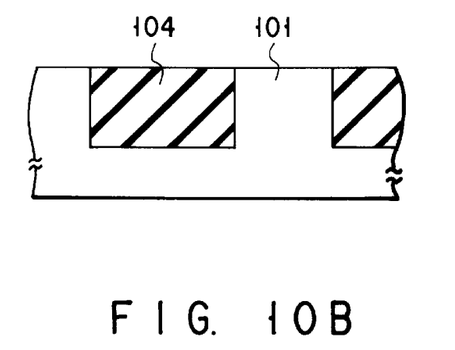

Subsequently, as shown in FIGS. 10A and 10B, a 350 nm thick oxide film 104, serving as an element the substrate to bury the element isolating groove 103 by the CVD (chemical vapor deposition). Thereafter, the overall surface of the oxide film is polished until the silicon substrate 1 is exposed.

Figure 11A:
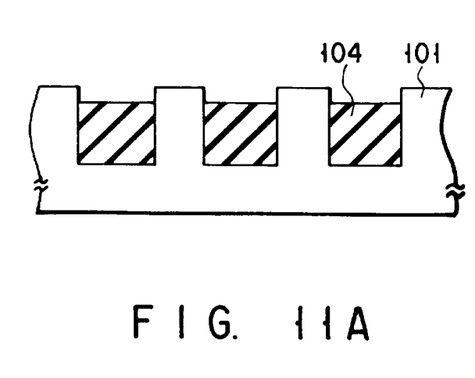
Figure 11B:
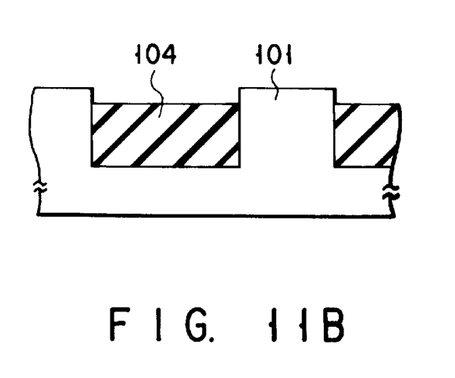

Thereafter, as shown in FIGS. 11A and 11B, the upper surface of the oxide film 104 is partially etched using a buffered hydrofluoric acid solution. As a result, a difference in level of 50 nm is made between the oxide film 104 and the substrate 101. The surface of the substrate may be thermal-oxidized before etching.

Figure 12A:
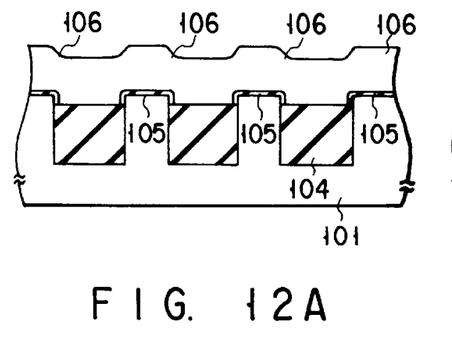
Figure 12B:
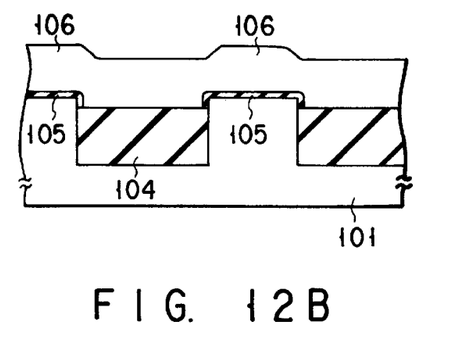

Then, as shown in FIGS. 12A and 12B, a 10 nm thick tunnel gate oxide film 105 is formed on the surface of the substrate by the thermal oxidation. On the tunnel gate oxide film 105 and the oxide film 104, a 300 nm thick amorphous silicon film 106, serving as a floating gate electrode, is formed by the CVD. To form the silicon film 106, for example, silane is used as a material, and the substrate temperature is set to, for example, 525° C.

Subsequently, as shown in FIGS. 13A and 13B, heat treatment is performed in a nitrogen atmosphere at a temperature of 600° C. for two hours, thereby poly-crystallizing the amorphous silicon film. The poly-crystallized silicon film 106 is processed into the shape of a floating gate electrode by the reactive ion etching. A laminated insulating film 108, serving as a gate electrode insulating film, is formed on the surface of the floating gate electrode 106. More specifically, a 5 nm thick silicon oxide film, a 6 nm thick silicon nitride film and a 5 nm thick oxide film are successively formed by the CVD, to form the laminated insulating film 108.

Subsequently, a 300 nm thick polycrystalline silicon film 109 doped with impurity, serving as a control gate electrode, is formed by the CVD. To form the polycrystalline silicon film, for example, silane is used as a material, the substrate temperature is set to, for example, 620° C., and an impurity, such as phosphor, is diffused into the polycrystalline silicon film.

The poly-crystallized silicon film 109 is processed into the shape of a control gate electrode by the reactive ion etching, and then the laminated insulating film 108 is processed into the shape of a gate electrode insulating film by the reactive ion etching (FIGS. 14A and 14B). At this time, the gate length in the perfect exposure chip as shown in FIG. 14A is 0.25 $\mu$m, while the gate length in the imperfect exposure chip as shown in FIG. 14B is 0.5 $\mu$m.

Then, an n-type impurity, for example, arsenic is doped into a surface region of the substrate, using the control gate electrode 19 as a mask. As a result, an n-type source/drain region 110 is formed in a self-aligning manner.

Finally, to activate the impurity, heat treatment is performed in an oxygen atmosphere at a temperature of 850° C., thus forming an NAND EEPROM.

As described above, in the method of manufacturing a semiconductor device according to this embodiment, a loose design rule is applied to the chips in the imperfect exposure field in the peripheral portion of a wafer. Therefore, the pattern transferred to the wafer is not removed due to imperfect exposure throughout the aforementioned manufacturing steps. Further, since the open/close ratios in the central portion and the peripheral portion of the wafer are substantially the same, variance in process accuracy due to a microloading effect can be prevented.

Additional advantages and modifications will readily occur to those skilled in the art. Therefore, the invention in its broader aspects is rot limited to the specific details and representative embodiments shown and described herein. Accordingly, various modifications may be made without departing from the spirit of scope of the general inventive concept as defined by the appended claims and their equivalents.

I claim:

1. A semiconductor device wafer comprising:

a semiconductor substrate:

a plurality of semiconductor device chips having a perfect outline, each including a pattern formed according to a predetermined design rule; and a plurality of outline imperfect chips, surrounding the plurality of semiconductor device chips on the semiconductor substrate, and having an imperfect outline, due to including an edge of the semiconductor substrate, each of the plurality of outline imperfect chips including a pattern formed according to a looser design rule than the predetermined design rule.

2. The semiconductor device wafer according to claim 1, wherein each of the semiconductor device chips includes a plurality of first wires, and a minimum width of the first wires is at most 0.30 μm.

3. The semiconductor device wafer according to claim 2, wherein each of the outline imperfect chips includes a plurality of second wires, and a minimum width of the second wires is 1.6 to 2.4 times that of the minimum width of the first wires.

4. The semiconductor device wafer according to claim 1, wherein each of the semiconductor device chips includes a plurality of first wiring layers and each of the outline imperfect chips includes a plurality of second wiring layers, a ratio of a wiring area to a non-wiring area in each of the plurality of second wiring layers being substantially the same as that in each of the plurality of first wiring layers.

5. The semiconductor device wafer according to claim 1, wherein each of the semiconductor device chips includes a plurality of first wires and each of the outline imperfect chips includes a plurality of second wires, a minimum width of the second wires being 1.6 to 2.4 times that of a minimum width of the first wires; and each of the semiconductor device chips includes a plurality of first wiring layers and each of the outline imperfect chips includes a plurality of second wiring layers, a ratio of a wiring area to a non-wiring area in each of the plurality of second wiring layers being substantially the same as that in each of the plurality of first wiring layers.

6. The semiconductor device wafer according to claim 1, wherein each of the semiconductor device chips includes a plurality of first contact holes, and a minimum diameter of the first contact holes is at most 0.3 μm.

7. The semiconductor device wafer according to claim 6, wherein each of the outline imperfect chips includes a plurality of second contact holes, and a minimum diameter of the second contact holes is 1.6 to 2.4 times that of the minimum diameter of the first contact holes.

* * * * *

UNITED STATES PATENT AND TRADEMARK OFFICE
CERTIFICATE OF CORRECTION

PATENT NO.: 5,990,540

DATED: November 23, 1999

INVENTOR(S): Noboru YOKOYA

It is certified that an error appears in the above-identified patent and that said Letters Patent is hereby corrected as shown below:

In Claim 6, column 10, line 23:

Delete "0.3" and insert --0.35--.

Signed and Sealed this

Twelfth Day of December, 2000

*Attest:*

Q. TODD DICKINSON

*Attesting Officer*  *Director of Patents and Trademarks*